United States Patent
Pope et al.

(10) Patent No.: US 9,674,986 B2
(45) Date of Patent: Jun. 6, 2017

(54) PARALLEL HEAT SPREADER

(71) Applicant: Apple Inc., Cupertino, CA (US)

(72) Inventors: Benjamin J. Pope, Cupertino, CA (US); Scott A. Myers, Cupertino, CA (US); Ihtesham H. Chowdhury, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 27 days.

(21) Appl. No.: 14/816,122

(22) Filed: Aug. 3, 2015

(65) Prior Publication Data

US 2017/0042058 A1 Feb. 9, 2017

(51) Int. Cl.
*H05K 7/20* (2006.01)
*H01L 23/34* (2006.01)
*H01L 23/473* (2006.01)

(52) U.S. Cl.
CPC ............. *H05K 7/205* (2013.01); *H01L 23/34* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | |
|---|---|---|
| 4,104,523 A | 8/1978 | Wolfert |
| 4,614,528 A | 9/1986 | Lennen |
| 4,620,248 A | 10/1986 | Gitzendanner |
| 4,863,499 A | 9/1989 | Osendorf |
| 4,967,201 A | 10/1990 | Rich, III |
| 4,975,761 A | 12/1990 | Chu et al. |
| 4,982,783 A | 1/1991 | Fickett et al. |
| 5,025,336 A | 6/1991 | Morehouse et al. |
| 5,050,038 A | 9/1991 | Malaurie et al. |
| 5,148,337 A | 9/1992 | Cullen et al. |
| 5,225,104 A | 7/1993 | Van Steenkiste et al. |
| 5,392,177 A | 2/1995 | Chainer et al. |
| 5,440,172 A | 8/1995 | Sutrina |
| 5,500,785 A | 3/1996 | Funada |
| 5,586,007 A | 12/1996 | Funada |
| 5,781,768 A | 7/1998 | Jones, Jr. |

(Continued)

FOREIGN PATENT DOCUMENTS

| | | |
|---|---|---|
| JP | 2000252667 | 9/2000 |
| JP | 2004022928 | 1/2004 |

OTHER PUBLICATIONS

Jeon et al., Thermal Conductivity Measurement of Anisotropic Material Using Photothermal Deflection Method, Thermochimica Acta, vol. 477, Issue 1, pp. 32-37, 2008.

*Primary Examiner* — Anthony Haughton
*Assistant Examiner* — Razmeen Gafur
(74) *Attorney, Agent, or Firm* — Michael H. Lyons

(57) ABSTRACT

A heat spreader including multiple layers of anisotropic material to conduct thermal energy. Multiple graphite sheet layers may be laminated and each sheet may be thermally connected to one or more thermal energy sources in a portable electronic device. Methods for making a heat spreader are also disclosed.

20 Claims, 8 Drawing Sheets

(56) References Cited

U.S. PATENT DOCUMENTS

| | | |
|---|---|---|
| 5,792,677 A | 8/1998 | Reddy et al. |
| 5,843,333 A | 12/1998 | Hakemi |
| 5,898,573 A | 4/1999 | Fugaro |
| 5,905,636 A | 5/1999 | Baska et al. |
| 6,076,171 A | 6/2000 | Kawata |
| 6,143,058 A | 11/2000 | Dahlgren et al. |
| 6,160,705 A | 12/2000 | Stearns et al. |
| 6,175,088 B1 | 1/2001 | Saccocio |
| 6,212,071 B1 | 4/2001 | Roessler et al. |
| 6,239,972 B1 | 5/2001 | Tehan et al. |
| 6,243,269 B1 | 6/2001 | Dibene et al. |
| 6,243,656 B1 | 6/2001 | Arai et al. |
| 6,286,212 B1 | 9/2001 | Eaton |
| 6,347,037 B2 | 2/2002 | Iijima et al. |
| 6,407,595 B1 | 6/2002 | Huang et al. |
| 6,462,410 B1 | 10/2002 | Novotny et al. |
| 6,504,243 B1 | 1/2003 | Andric et al. |
| 6,507,102 B2 | 1/2003 | Juskey et al. |
| 6,556,455 B2 | 4/2003 | Dibene et al. |
| 6,624,816 B1 | 9/2003 | Jones, Jr. |
| 6,687,320 B1 | 2/2004 | Chiu et al. |
| 6,747,300 B2 | 6/2004 | Nadd et al. |
| 6,778,387 B2 | 8/2004 | Fairchild |
| 6,803,328 B2 | 10/2004 | McCullough |
| 6,832,410 B2 | 12/2004 | Hegde |
| 6,847,529 B2 | 1/2005 | Dibene et al. |
| 6,886,625 B1 | 5/2005 | Sagal et al. |
| 6,891,724 B2 | 5/2005 | De Lorenzo et al. |
| 6,896,045 B2 | 5/2005 | Panek |
| 6,900,992 B2 | 5/2005 | Kelly et al. |
| 6,930,885 B2 | 8/2005 | Barcley |
| 6,956,549 B2 | 10/2005 | Naiki |
| 6,987,671 B2 | 1/2006 | Houle |
| 7,006,353 B2 | 2/2006 | Matteson |
| 7,045,695 B1 | 5/2006 | Cohen et al. |
| 7,045,885 B1 | 5/2006 | Chen et al. |
| 7,085,135 B2 | 8/2006 | Chu et al. |
| 7,125,433 B2 | 10/2006 | Garikipati et al. |
| 7,148,125 B2 | 12/2006 | Takayama et al. |
| 7,149,909 B2 | 12/2006 | Cui et al. |
| 7,190,585 B2 | 3/2007 | Houle |
| 7,215,551 B2 | 5/2007 | Wang et al. |
| 7,269,015 B2 | 9/2007 | Hornung et al. |
| 7,270,176 B2 | 9/2007 | Bell et al. |
| 7,295,441 B1 | 11/2007 | Laio et al. |
| 7,301,755 B2 | 11/2007 | Rodriguez et al. |
| 7,303,005 B2 | 12/2007 | Reis et al. |
| 7,393,226 B2 | 7/2008 | Clayton et al. |
| 7,401,243 B2 | 7/2008 | Knepper et al. |
| 7,433,191 B2 | 10/2008 | Blanco, Jr. et al. |
| 7,440,281 B2 | 10/2008 | Bailey et al. |
| 7,451,332 B2 | 11/2008 | Culbert et al. |
| 7,454,316 B2 | 11/2008 | Bose et al. |
| 7,532,480 B1 | 5/2009 | Mimberg |
| 7,671,282 B2 | 3/2010 | Lee |
| 7,709,951 B2 | 5/2010 | Brodsky et al. |
| 7,730,336 B2 | 6/2010 | Marinkovic et al. |
| 7,782,613 B2 | 8/2010 | Harris |
| 7,787,249 B2 | 8/2010 | Sundstrom |
| 7,787,252 B2 | 8/2010 | Mertol |
| 7,800,916 B2 | 9/2010 | Blackwell et al. |
| 7,805,689 B2 | 9/2010 | Ueda et al. |
| 7,840,827 B2 | 11/2010 | Dahan et al. |
| 7,866,941 B2 | 1/2011 | Li et al. |
| 7,880,586 B2 | 2/2011 | Fagrenius et al. |
| 7,882,369 B1 | 2/2011 | Kelleher et al. |
| 7,973,473 B2 | 7/2011 | DeCook et al. |
| 8,076,661 B2 | 12/2011 | McCarthy et al. |
| 8,115,112 B2 | 2/2012 | Corisis et al. |
| 8,144,275 B2 | 3/2012 | Zhang et al. |
| 8,165,646 B2 | 4/2012 | Zheng |
| 8,215,012 B2 | 7/2012 | Blanco, Jr. et al. |
| 8,253,026 B2 | 8/2012 | Strauss et al. |
| 8,260,097 B2 | 9/2012 | Meadowcroft et al. |
| 8,345,414 B2 | 1/2013 | Mooring et al. |
| 8,379,160 B2 | 2/2013 | Takenaka et al. |
| 8,383,962 B2 | 2/2013 | Sutardja |
| 8,477,490 B2 | 7/2013 | Rothkopf et al. |
| 8,482,929 B2 | 7/2013 | Slaton et al. |
| 8,525,840 B2 | 9/2013 | Hendry et al. |
| 8,735,728 B2 | 5/2014 | Cheng |
| 9,063,713 B2 | 6/2015 | Sumpter |
| 9,125,299 B2 | 9/2015 | Wittenberg et al. |
| 9,223,167 B2 | 12/2015 | Kalyanasundaram |
| 2005/0077614 A1 | 4/2005 | Chengalva et al. |
| 2006/0120051 A1 | 6/2006 | Macris et al. |
| 2006/0134831 A1 | 6/2006 | Cohen et al. |
| 2007/0053168 A1* | 3/2007 | Sayir ............... B32B 18/00 361/718 |
| 2007/0102142 A1* | 5/2007 | Reis ............... H01L 23/3677 165/80.3 |
| 2008/0019097 A1* | 1/2008 | Zhang ............... F28F 13/00 361/704 |
| 2008/0019098 A1* | 1/2008 | Sung ............... C23C 16/274 361/706 |
| 2008/0049394 A1 | 2/2008 | Nishi |
| 2008/0062651 A1* | 3/2008 | Reis ............... C09K 5/041 361/710 |
| 2008/0089069 A1* | 4/2008 | Medendorp ............... F21S 8/04 362/294 |
| 2008/0093053 A1* | 4/2008 | Song ............... H01L 23/427 165/80.3 |
| 2008/0218977 A1* | 9/2008 | Reis ............... H04N 5/2256 361/711 |
| 2008/0298016 A1* | 12/2008 | Karidis ............... H01L 23/433 361/698 |
| 2008/0298021 A1* | 12/2008 | Ali ............... H01L 23/3732 361/705 |
| 2009/0141452 A1* | 6/2009 | Wayman ............... H01L 23/367 361/704 |
| 2009/0190312 A1* | 7/2009 | Katayama ............... H01L 21/268 361/708 |
| 2010/0315783 A1* | 12/2010 | Lemak ............... H01L 23/373 361/708 |
| 2011/0007479 A1* | 1/2011 | Tam ............... H01L 25/0652 361/721 |
| 2011/0014417 A1* | 1/2011 | Lemak ............... H01L 23/373 428/99 |
| 2011/0085304 A1 | 4/2011 | Bindrup et al. |
| 2011/0194252 A1 | 8/2011 | Wang |
| 2011/0232881 A1 | 9/2011 | Downing et al. |
| 2012/0261106 A1* | 10/2012 | Kelly ............... F28F 3/022 165/185 |
| 2012/0318484 A1 | 12/2012 | Hirasawa |
| 2013/0057835 A1* | 3/2013 | Reis ............... F21V 29/004 353/52 |
| 2013/0141870 A1* | 6/2013 | Rothkopf ............... G06F 1/1626 361/707 |
| 2013/0213630 A1* | 8/2013 | Southard, II ............... B32B 18/00 165/185 |
| 2013/0329366 A1* | 12/2013 | Wang ............... H05K 7/20963 361/704 |
| 2014/0224466 A1* | 8/2014 | Lin ............... B82Y 30/00 165/185 |
| 2014/0345843 A1* | 11/2014 | Kirkor ............... F28F 23/00 165/185 |
| 2014/0368992 A1* | 12/2014 | Strader ............... H01L 23/3675 361/679.54 |
| 2014/0371931 A1 | 12/2014 | Lin et al. |
| 2015/0090434 A1* | 4/2015 | Lemak ............... H01L 23/3733 165/185 |
| 2015/0189792 A1* | 7/2015 | Kenna ............... B23P 15/26 361/704 |

\* cited by examiner

PARALLEL HEAT SPREADER

FIELD

Embodiments described herein generally relate to a heat spreader for thermal energy dissipation in an electronic device, and more particularity to a heat spreader having multiple layers.

BACKGROUND

Heat spreaders are used in many electronic devices to provide a thermal path from a heat source to an outside medium. Heat spreaders typically dissipate heat by conduction, transferring heat from one solid to another. Heat spreaders also transfer heat by thermal radiation to a body with a different surface temperature.

Often, modern electronic devices have multiple heat sources in a limited space. Providing separate, discrete runs for multiple heat spreaders may be difficult given the compact nature of modern electronic devices and the limited space available within such devices' housings. However, using a single heat spreader for multiple heat sources may result in transferring heat inefficiently, or not at all, from the heat sources.

SUMMARY

Embodiments described herein may relate to, include, or take the form of heat spreaders that move heat between a heat source in a portable electronic device and a heat exchanger whose surface area and geometry are more favorable than the heat source. In some embodiments, the heat spreader may be pyrolytic graphite or copper. Heat is spread out over the geometry of the heat spreader to a heat spreader or heat exchanger where it can be dissipated into the surrounding environment such as air.

One sample embodiment may take the form of a heat spreader, comprising: a group of layers, each layer in the group formed from an anisotropic thermal material; at least one contact region adjacent each layer; wherein each layer is affixed to an adjacent layer.

Yet another embodiment may take the form of a portable electronic device comprising: a heat source; and a heat spreader connected to the heat source and comprising a group of layers, each layer formed from an anisotropic thermal material; wherein a layer of the group of layers is thermally connected to the heat source; and the layer preferentially conducts heat in a first direction as opposed to in a second direction.

Still another embodiment may take the form of a method for making a thermal spreader, comprising the operations of: forming one or more contact regions on each of a group of sheets formed from an anisotropic thermal material; and affixing each of the group of sheets to at least one other of the group of sheets.

These and other structures, methods, apparatuses, and functions will be apparent to those of ordinary skill in the relevant art upon reading the specification in its entirety.

BRIEF DESCRIPTION OF THE DRAWINGS

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

DETAILED DESCRIPTION

Figure 1:
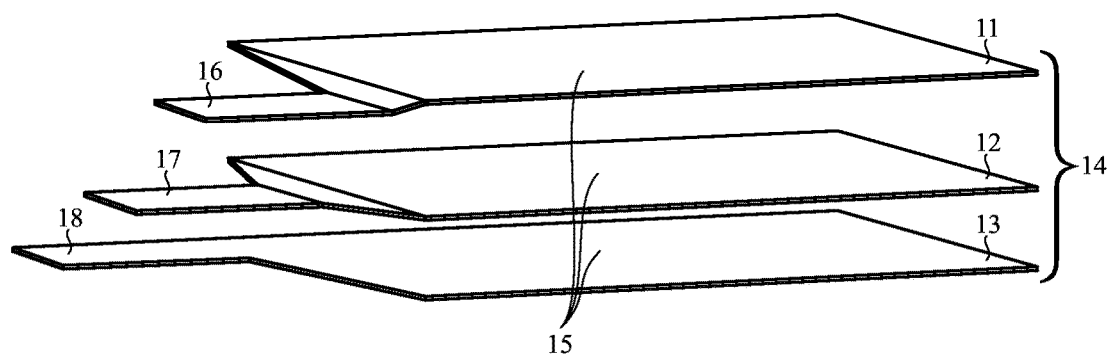
FIG. 1 is an exploded view of a heat spreader including multiple layers.

Reference will now be made in detail to representative embodiments illustrated in the accompanying drawings wherein like reference numerals denote like structure throughout each of the various figures. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims. These and other embodiments are discussed below with reference to FIGS. 1-14.

Embodiments described herein may take the form of a heat spreader that transfers heat from a location or component to another location or component, such as a dedicated heat sink. The heat spreader may define multiple layers, each of which may channel heat separately from one another. The layers may by adjacent one another and, in some embodiments, may touch one another. Such layers may be stacked atop one another or otherwise placed next to one another (for example, as separate columns).

The heat spreader may define multiple contact regions, which are the areas of the heat spreader that physically or thermally engage a heat source. Thus, the heat spreader may simultaneously engage multiple heat sources and/or may transfer heat to multiple sites. Each layer of the heat spreader may have one or more such contact regions.

In some embodiments, the heat spreader may also provide structural support to various components within an electronic device. For example, the heat spreader may serve as a stiffener. Components may be thermally separated from the heat spreader by thermal insulation so that the heat spreader may provide support but not heat to such components.

The heat spreader may be made of any suitable material; in some instances the heat spreader is formed from an anisotropic material that transmits heat well in one direction (such as along a length of the heat spreader) and poorly, or not at all, in another direction (such as through a thickness of the heat spreader). That is, an anisotropic thermal material may preferentially transmit heat in a first direction as opposed to in a second direction. Further, layers may be formed from a single, homogenous substance or homogenous mixture of substances such that the entire material exhibits the thermally anisotropic property. Accordingly, any part of a "layer" or "sheet" of anisotropic thermal material will conduct heat equally well (or poorly).

As one non-limiting example, heat spreaders described herein may be formed from pyrolytic graphite in whole or in part, insofar as pyrolytic graphite exhibits the aforementioned anisotropic heat transfer function. Rather than dissipate through the thickness of the graphite sheet, heat travels primarily along the length of the sheet thus conducting heat in a desired path to a particular destination within or outside of the portable electronic device. (In this example, the pyrolytic graphite is configured to transfer heat along its length and resist heat transfer through its thickness.) Pyrolytic carbon may function similarly and thus may also be used in various embodiments discussed herein.

Anisotropic heat spreaders may be used to construct multi-layered heat spreaders. Generally, an anisotropic heat spreader conducts heat well in one direction (a "preferred direction") and poorly, or not at all, in other directions. Typically, some minimal heat conduction still occurs in the other directions but the effective distance along which thermal energy may be conducted is limited; a maximum conductive distance exists in such directions. This maximum conductive distance, referred to herein as the "effective dimension," varies with the material used to form a layer of the heat spreader. Increasing size beyond the effective dimension does not increase the capacity of the material to transmit heat, even along the preferred direction of heat transfer.

For example, pyrolytic graphite sheets transfer heat well in one direction, but heat dissipation is limited after about 40 microns in a non-transferring direction. 40 microns (or thereabouts) is thus the effective dimension of pyrolytic graphite.

Consider a graphite sheet configured to transfer heat along its length and resist heat transfer along its height (e.g., thickness). Increasing the thickness of the graphite sheet does not substantially change the heat transfer characteristics of the sheet once the effective dimension is exceeded. Thus, pyrolytic graphite and other materials that anisotropically transfer heat ("anisotropic thermal materials") may be formed into layers in order to provide multiple channels or paths for heat transfer in a preferred direction; each such layer may h approximately the effective dimension or greater in a non-preferred direction, in order to reduce, minimize or prevent heat transfer between layers.

FIG. 1 depicts an exploded view of a multi-layer heat spreader 14. Multiple graphite sheets 11, 12, and 13 may be form the single heat spreader 14. Each of sheets 11, 12, and 13 include a heat transfer portion 15 and contact regions 16, 17, and 18 respectively, all of which can be formed from the same material but may (or may not) have different dimensions. Each of the multiple graphite sheet layers 11, 12, 13, may be connected to a unique heat source, or multiple layers may be connected to a single heat source through connection regions 16, 17, 18 as discussed below. In the latter embodiment, the multiple layers 11, 12, 13 may cooperate to transfer more heat from a single source than can be achieved by any single layer alone. In some embodiments and as shown in FIG. 1, only a single layer 11 is physically adjacent the heat source.

Typically, although not necessarily, the layers 11, 12, 13 may be formed from an anisotropic thermal material and have a thickness that is equal to or greater than the material's effective dimension. The shape, size and/or dimensions of the heat spreader 14 and its constituent layers 11, 12, 13 may be varied to account for the presence of other components within an electronic device or within another bounded area. As one non-limiting example, one or more of the layers may be locally thinned or shaped to avoid contact with a nearby electronic component.

In some embodiments, one or more of the layers may be locally thinned below the effective dimension, such that heat may be transferred between layers 11, 12, 13. For example, the layers may form a stepped configuration so that heat is passed between layers along the length of the heat spreader. Local thinning below the effective dimension may permit heat transfer between layers 11, 12, 13, which may be useful for negotiating geometries/layouts within an electronic device.

Figure 2:
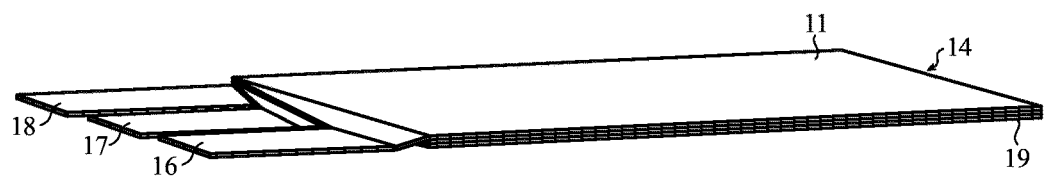
FIG. 2 is depicts a heat spreader including multiple layers.

FIG. 2 depicts heat spreader 14, as assembled. Graphite sheet layers 11, 12, 13 may be laminated, adhered, or otherwise affixed to one another. As shown in FIGS. 1 and 2, a first layer 13 may be straight from contact region 18 to heat transfer portion 15. Other layers may be bent, angled or otherwise non-planar at a juncture between the contact regions 16, 17 and heat transfer portions 15. These angled intersections may permit the layers 11, 12, 13 to be stacked adjacent one another while maintaining a uniform thickness for the heat spreader 14.

Alternatively, the layers need not be of uniform thickness and often are not. Rather, the layers may be configured such that the entire stack (e.g., heat spreader 14) has a uniform thickness when assembled. Layers may have a thickness at or slightly above the effective dimension in such embodiments; if heat transfer between layers is to be effected, the layers may be have a thickness below the effective dimension, at least in some regions.

As also shown in FIG. 2, the contact regions 16, 17, 18 generally do not touch one another when the sheets are attached.

In some embodiments, sheets 19 of thermoplastic polymer resin such as polyethylene terephthalate (e.g., PET) may be laminated between sheet layers to form heat spreader 14. PET laminates 19 may thus provide thermal insulation between sheet layers 11 and 12 and also between sheet layers 12 and 13. In embodiments permitting heat transfer between layers or where the layers are sufficiently thick, PET or other insulators may be omitted. Other sample insulators include thermal barrier adhesives and the like.

Accordingly, a sample heat spreader 11 may be formed from multiple layers 11, 12, 13 that are stacked atop one another. Although three layers are shown, more or fewer may be employed in various implementations. The layers 11, 12, 13 may take the form of sheets or other planar constructs and may be aligned with one another; in other embodiments the layers may be non-planar and may not be sheets. Although the layers 11, 12, 13 are shown as having the same size, any or all dimensions of the layers 11, 12, 13 may vary with respect to other layers.

Each layer 11, 12, 13 may physically and thermally connect to a contact region 16, 17, 18, which in turn thermally and physically contact a heat source. Angled regions or interfaces may physically connect the contact regions and the layers. These angled interfaces may permit the layers to be stacked atop one another while the contact regions are coplanar. Put another way, the contact regions may be coplanar with respect to a common plane, insofar as they are side by side, while the layers are not coplanar with respect to the common plane, since they are stacked instead of side by side (e.g., they are perpendicular to the common plane). By including the angled interfaces, the overall thickness of any given layer 11, 12, 13 and its respective contact region 16, 17, 18 may be uniform, which may permit manufacture of a layer, angled interface and contact region from a single, uniform material. In some embodiments, the angled interfaces may be replaced by a stepped interface.

Figure 3:
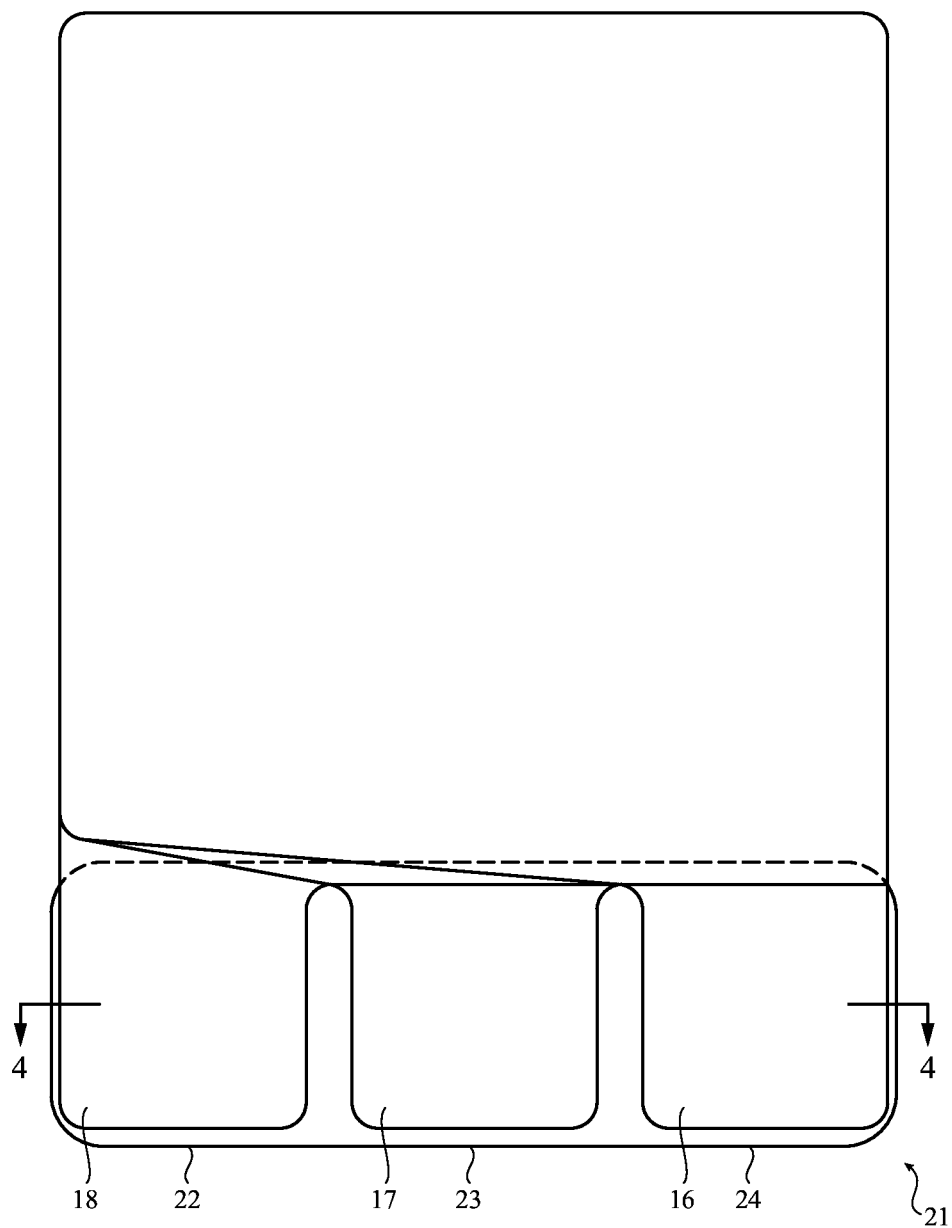
FIG. 3 is a top view of a heat spreader thermally connected to a single heat source.

Referring to FIG. 3, heat spreader 14 may be thermally connected to a heat source 21; portions of the heat source that are concealed by the heat spreader 14 are shown in dashed lines. In some embodiments, layers 11, 12, 13 that are connected to single heat source 21 independently of one another. That is each of contact regions 16, 17, 18 may be separately connected to different portions 22, 23, 24 of heat source 21. This may be particularly useful where the design of the portable electronic device is such that the area adjacent the thermal source is dimensionally constrained. The heat source may be any electronic component that generates heat during its operation, such as a processing unit, graphics unit, storage device, and so on.

Further, since each contact region 16, 17, 18 contacts the same heat source 21, all three layers 11, 12, 13 may conduct heat from the heat source to a heat sink, or otherwise away from the heat source. Accordingly, a rate and/or amount of heat transfer may be increased insofar as multiple layers are cooperating to transfer heat.

In other embodiments and as discussed in more detail below, each of the contact regions 16, 17, 18 may contact different heat sources, or two contact regions may contact a first heat source while the third contacts a second heat source. It should be appreciated that the number of layers and/or contact regions in any given heat spreader may vary, as necessary, desired or useful. Thus, some heat spreaders 14 may have one layer while others may have two, or more than three.

Heat absorbed by the heat spreader 14 may be transferred to a heat sink or may be held by the heat spreader during operation of the heat source. The heat spreader may thus either transfer heat from a source to a sink (e.g., be thermally grounded), or may absorb and maintain generated heat and, optionally, expel that heat (e.g., be thermally vented). Because the heat spreader is physically larger and covers a greater area than most heat sources, and may have great heat absorption capacity than a heat source, heat may be spread across a region or volume greater than would be achieved without the use of the heat spreader 14. Thus, heat may be moved to different areas of an electronic device incorporating a heat source 21 and heat spreader 14, and/or heat may be kept below a threshold in the region of a heat source 21. The foregoing applies to any version of a heat spreader discussed herein.

Figure 4:
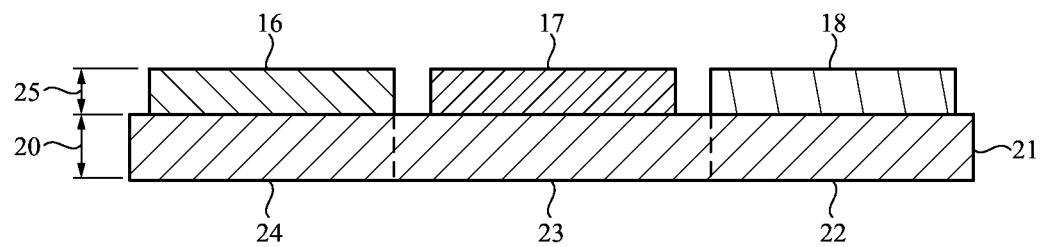
FIG. 4 is a cross-sectional view taken along line 4-4 of FIG. 3.

FIG. 4 is a side cross-sectional view taken along line 4-4 of FIG. 3. Contact regions 16, 17, 18 are shown adjacent heat source 21. As illustrated, each contact region 16, 17, 18 is adjacent a separate region 24, 23, 22 (respectively) of the heat source.

The heat source 21 may have a relatively uniform thickness 20, although this is not necessary. Likewise, the contact regions 16, 17, 18 have a common thickness 25. Insofar as the contact regions 16, 17, 18 are coplanar and aligned along the length of the heat source 21, the overall thickness of the structure formed by heat source and heat spreader is relatively constant (e.g., thickness 20 plus thickness 25). Thus, the heat source and heat spreader may be relatively low profile in at least one dimension, which may simplify finding space for the heat spreader and/or heat source within an electronic device enclosure.

Figure 5:
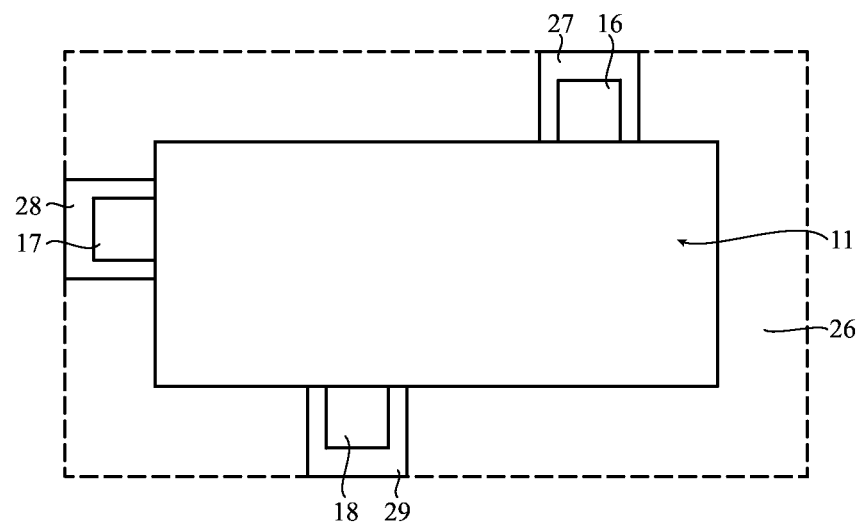
FIG. 5 is a top view of a multilayer heat spreader thermally connected to multiple heat sources.

While contact regions 16, 17, 18 of graphite layers 11, 12, 13 respectively have been shown thermally connected at different portion of heat source 21, it can be appreciated that contact regions 16, 17, 18 could be thermally connected to multiple heat sources. FIG. 5 illustrates such an embodiment, showing a top view of a heat spreader 11 connected to multiple heat sources 27, 28, 29. Further and as also illustrated, contact regions 16, 17, 18 are located along different edges of the heat spreader 14. Thus, it should be appreciated that the contact regions 16, 17, 18 may be configured in order to abut particular heat sources 27, 28, 29 in a particular electronic device. For example, connector 16 may be thermally connected to a main logic board (MLB), connector 17 may be thermally connected to a memory module and connector 18 may be thermally connected to a processing unit within a volume of a sample electronic device 26, the sidewalls of which are shown in dashed lines for illustrative purposes.

Figure 6:
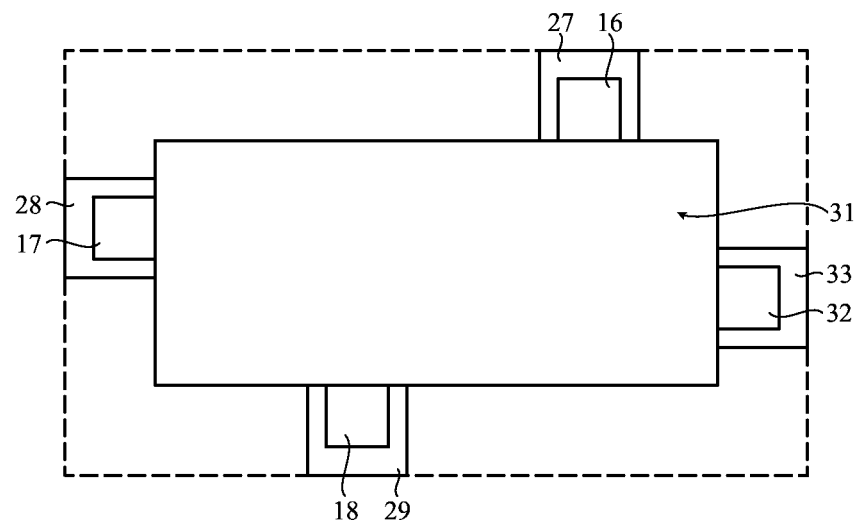
FIG. 6 is a top view of a heat spreader having four layers and thermally connected to multiple heat sources.
Figure 7:
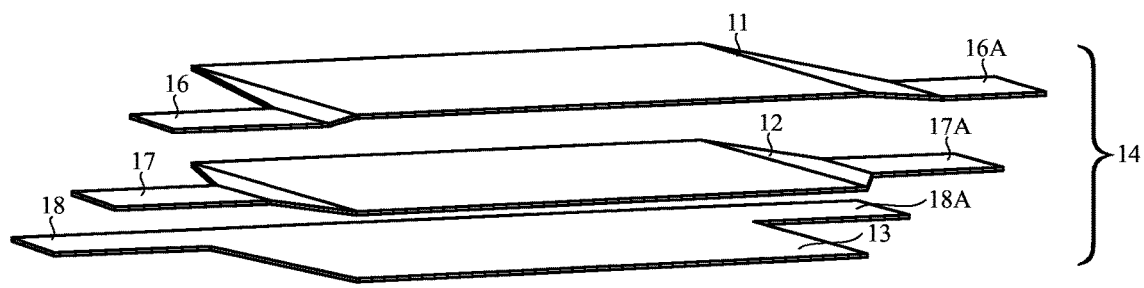
FIG. 7 is an exploded view of a heat spreader having multiple layers and multiple thermal connections on each layer.

Referring to FIG. 6, in another embodiment, more or fewer than three graphite sheet layers may be included in heat spreader 14. For example, a fourth graphite sheet layer 31 may be included with a contact region 32. Contact region 32 of the fourth sheet may be connected to another heat source 33 such as, for example, a camera, integrated circuit or the like. Referring to FIG. 7, in another embodiment, a heat spreader 14 may include more than one contact region for each layer. In this embodiment, graphite sheet layers 11, 12, 13 include a number of contact regions 16, 16A, 17, 17A, 18, and 18A. Contact regions 16 and 16A are part of graphite sheet layer 11, contact regions 17 and 17A are part of graphite sheet layer 12, and contact regions 18 and 18A are part of graphite sheet layer 13. In this embodiment, for example, each of contact regions 16 and 16A may be connected to two different heat sources.

Figure 8:
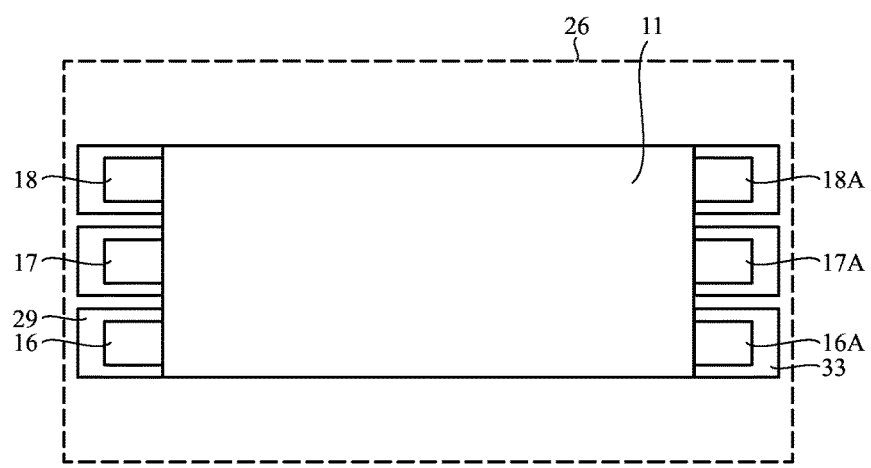
FIG. 8 is a top view of a multi-layer heat spreader with each layer connected to multiple thermal sources.

FIGS. 7 and 8 shows another example of a heat spreader 14 in which each layer 11, 12, 13 has multiple contact regions. Here, each pair of contact regions (e.g., 16 and 16A, 17 and 17A, 18 and 18A) are positioned at opposing ends of the respective layers 11, 12, 13. This may be useful when one contact region (for example, 18) is affixed to a heat source and the opposing contact region (for example 18A) on the same layer is connected to a heat sink. Thus, the heat spreader 14 may efficiently transfer heat to and from various portions of the electronic device.

As another example, each layer 11, 12, 13 may be thermally connected to or from multiple heat sources so as to minimize the number of layers needed to cool various portions of the device. Continuing the example, presume connectors 16, 16A are thermally connected to portions of the electronic device that typically do not generate thermal energy at the same time. For example, contact region 16 could be connected to first heat source 29 while contact region 16A could be connected to second heat source 33. When heat source 29 is active, heat source 33 may not be and thus thermal energy (e.g., heat) generated by source 29 may be transferred through layer 11 or spread across layer 11. This heat may be radiated from the layer or may be transferred to a heat sink in order to cool heat source 29. The same is true when heat source 33 is active and heat source 29 is quiescent.

Similarly, contact regions 17 and 17A and contact regions 18 and 18A could be connected to different thermal energy sources within the portable electronic device that are not expected to generate significant thermal energy at the same time. The use of multiple graphite layers and multiple contact regions for each layer may enhance a heat dissipating capability of each graphite layer while remaining within an overall size limitation of an electronic device.

Figure 9A:
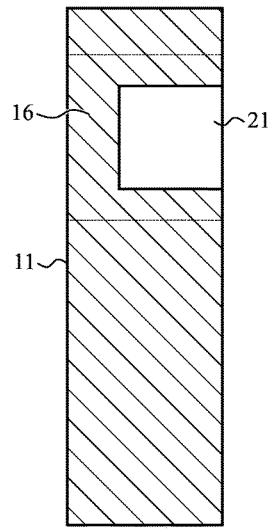
FIG. 9A is a side view of a portable electronic device including a heat source.
Figure 9B:
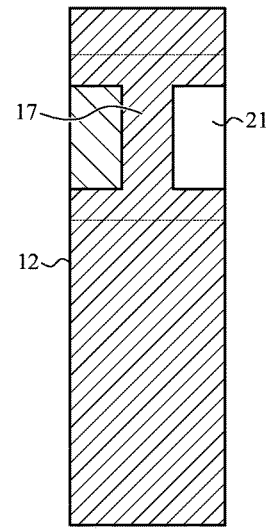
FIG. 9B is a side view of a portable electronic device with a first layer of a heat spreader partially covering a thermal source.
Figure 9C:
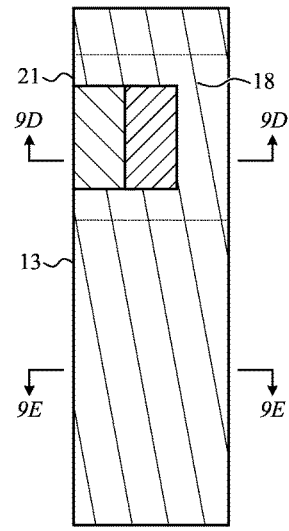
FIG. 9C is a side view of a portable electronic device with a second layer of a heat spreader covering a first layer and partially covering a thermal source.

FIGS. 9A-9E show various views of different layers of a multi-layer heat spreader 14, in which each layer 11, 12, 13 of the heat spreader is thermally and physically connected to a single heat source 21. It should be appreciated that the particular configuration shown in FIGS. 9A-9E is but one of many suitable configurations and accordingly is not meant to be limiting. Each figure will be discussed in turn; FIGS. 9A-9C are intended to illustrate successive layers of a heat spreader and their relationship to a heat source 21.

FIG. 9A shows a first anisotropic thermal layer 11 of the heat spreader connected, at contact region 16, to heat source 21; the second and third layers are not shown in this figure but are in later figures. Portions of heat source 21 that are not visible in the view of FIG. 9A are indicated by dashed lines. The contact region 16 is defined by a narrowed region or neck, as shown in FIG. 9A. The dimensions of the contact region 16 (and all other contact regions shown in FIGS. 9A-9D) may vary between embodiments, as may the relative position of the contact region with respect to either or both of the sheet 11 and heat source 21.

FIG. 9B depicts first and second anisotropic thermal layers 11, 12 physically and thermally connected to heat source 21 via second contact region 17; the third layer is not shown in this figure but is in later-discussed FIG. 9C. As shown in FIG. 9B and in the cross-sectional view of FIG. 9E, which is taken along line 9E-9E of FIG. 9C, the second anisotropic thermal layer 12 overlies the first anisotropic thermal layer 11. Further, contact region 17 extends downward from layer 12 to connect to heat source 21. Thus, presuming all layers 11, 12, 13 have uniform thickness, the second contact region 17 may be twice as thick as the first contact region 16. This variance in thickness is illustrated in FIG. 9D, which is a cross-section taken along line 9D-9D of FIG. 9C, and is discussed in more detail below.

FIG. 9C depicts first, second and third anisotropic thermal layer 11, 12, 13 as physically and thermally connected to a heat source 21. Insofar as the heat source 21 is not directly visible in FIG. 9C, its boundaries are shown in dashed lines. The third contact region 18 connects the third layer 13 to the heat source 21.

As shown in FIG. 9C, portions of all three contact regions 16, 17, 18 are visible in the depicted view. This is not necessary in any particular embodiment insofar as one or more lower layers 11, 12 may be fully covered by another layer but does facilitate understanding of the stacked nature of the layers 11, 12, 13 and contact regions 16, 17, 18.

Figure 9D:
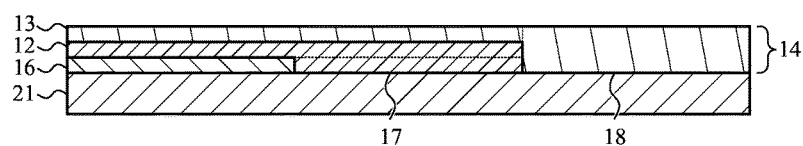
FIG. 9D is a side view of a portable electronic device is a side view of a portable electronic device with a third layer of a heat spreader covering the first and second layer and a thermal source.
Figure 9E:
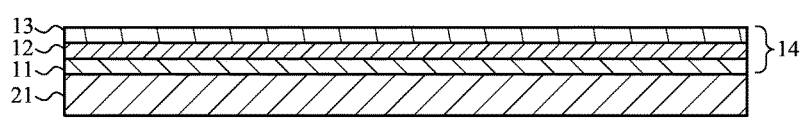
FIG. 9E is a cross-sectional view of a portable electronic device with first, second, and third thermal layers of a heat spreader covering a thermal source.

FIGS. 9D and 9E likewise serve to illustrate the stacked relationship of the layers 11, 12, 13, of the heat spreader 14. The cross-sectional view of FIG. 9D is taken through the contact regions 16, 17, 18 and shows how each extends from a corresponding layer 11, 12, 13 to contact the heat source 21. Layer 11 cannot be seen in the cross-sectional view of FIG. 9D but is visible in FIG. 9E.

The dashed lines between second contact region 17 and second layer 12, as well as third contact region 18 and third layer 12, illustrate the joinder of the contact regions and layers although such joinder may be conceptual only (e.g., the contact regions and their respective layers may be unitarily formed such that no joint or seam exists). Further as FIG. 9D illustrates, if the layers 11,12, 13 are of uniform thickness as shown in FIG. 9E, the second contact region 17 is thicker than the first contact region 16 while the third contact region 18 is thicker than the second contact region. The thickness of adjacent contact regions varies by the thickness of a layer, although this may vary between embodiments.

Figure 10:
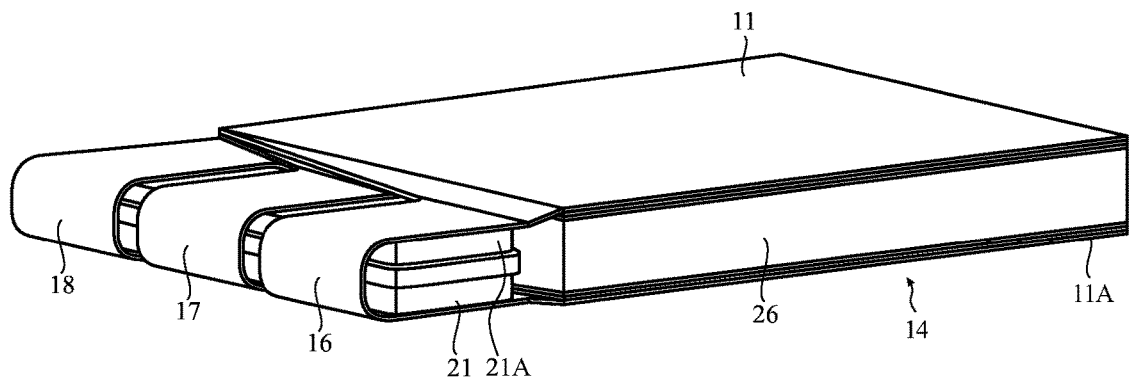
FIG. 10 shows a heat spreader wrapped around and engaging heat sources on opposing sides of a substrate.

FIG. 10 depicts a heat spreader 14 formed from a number of layers of anisotropic thermal material and configured to wrap around one or more heat sources. In the example of FIG. 10, elements 21 and 21A may be separate heat sources or may represent two sides (such as a top and a bottom) of a single heat source 21. As still another option, element 21 may be a heat source while element 21A is a heat sink. For the sake of simplicity, the following discussion will presume that there are two separate heat sources 21, 21A, although the discussion may also apply to an embodiment having a single heat source radiating heat from two or more surfaces.

The heat spreader 14 may be formed with two layers, such as sheets 11 and 11A, or two sets of layers, connected by one or more bent, turned, or wrapped contact regions 16, 17, 18. Each layer may be formed from a single anisotropic thermal material; that is, the contact region and the two sheets may be cut or otherwise formed from the single material. Alternately, each layer may be formed from multiple separate materials that are affixed to one another, for example with a heat-transmissive adhesive or a metal interface, such as a copper layer or via.

By contacting heat sources 21, 21A on opposing sides of a substrate, the heat spreader 14 may efficiently engage multiple heat sources and transfer heat away from those heat sources in a limited package volume. Further, the heat spreader 14 may engage a heat sink 26 and thus transfer heat from the heat sources 21, 21A to the heat sink. Insofar as opposing sides of the heat sink 26 are contacted by the heat spreader 14, the thermal gradient across a thickness of the heat sink (e.g., from the top to the bottom of the page in the view of FIG. 10) may be more constant than if the heat spreader contacted only a single side of the heat sink. Thus, depending on the dimensions of the heat sink 26 and/or heat spreader 14, the heat sink may absorb more thermal energy in the example shown in FIG. 10 than in configurations where only one side of a heat sink contacts a heat spreader.

It should also be appreciated that contact regions 16, 17, 18 may each contact the same heat sources 21, 21A or may contact different heat sources, as discussed above. Further, in order to promote heat transfer between layers of the heat spreader 14 and into the heat sink 26, adjacent layers of the heat spreader may be connected with thermally conductive pads, vias or the like to promote heat transfer between layers. These thermal connections between layers may be formed from any suitable metal (copper being one example), ceramic, adhesive, polymer or the like. The thermal connection(s) may extend through a layer to contact the heat sink 26, or may be placed adjacent layers but not within or through them. Further, a thermal connection may extend only partly through a layer. For example, the thermal connection may extend sufficiently far through a layer that the thickness of the layer, adjacent the connection, is less than the effective thickness.

Some sample heat spreaders may be formed from multiple materials. As an example, copper may connect adjacent layers of a heat spreader to form a multi-material thermal heat spreader. Metal contact regions or joints may connect layers of a heat spreader or to create a non-planar heat spreader (such as the heat spreader 14 shown in FIG. 10). In some embodiments the material forming a layer 11 of a heat spreader may be brittle and/or difficult to bend. As one example, graphite is a brittle material and may break before bending very far. While graphite might still be used to form an entirety of a non-planar heat spreader, such as the example of FIG. 10, the processes necessary to form the entire structure from graphite may be expensive and/or complex.

Using a conductive metal such as copper, nickel, silver or the like to form the bends, curves, edges and so on of a non-planar heat spreader 14 may reduce the complexity and/or cost of manufacture by taking advantage of metal's relative ductility. Further, many metals expel heat isotropically. By forming a portion of a heat spreader 14 out of metal, selective and localized isotropic heat radiation may be achieved while the rest of the heat spreader anisotropically conducts heat. This may permit enhanced heat dissipation in certain local regions while still conducting heat away from thermally sensitive regions.

While graphite sheet layers have been discussed in the above embodiments, other anisotropic materials may be used to construct the layers. For example, other materials that may display anisotropic thermal properties include boron nitride, aluminum nitride, and black phosphorene. Therefore, it should be understood that anisotropic thermal layers of any heat spreader described herein may formed from any suitable material, including those just listed. Anisotropic and isotropic thermal properties may be accounted for in selecting the most appropriate materials for the various layers, contact regions and the like.

Figure 11:
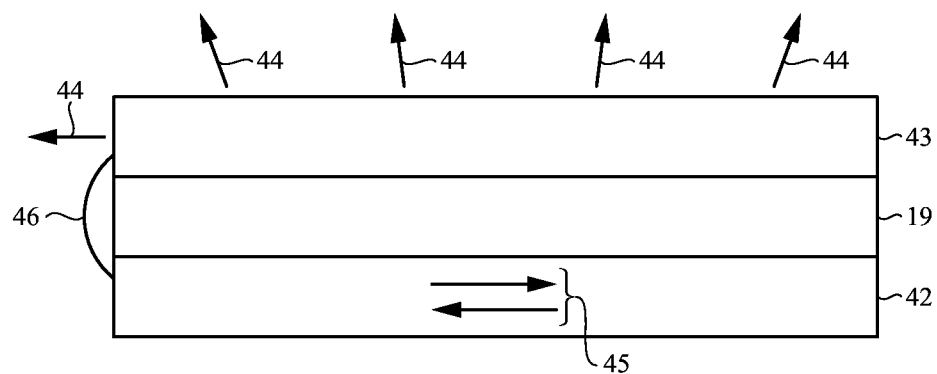
FIG. 11 is a side view of a multi-layer heat spreader having thermally transmissive properties in different directions, in different layers; an FIG. 12 is process flow diagram illustrating example operations of a method for forming a heat spreader.

Combinations of material may also be used for layers such as 11, 12, 13, and 37. For example, FIG. 11 illustrates a side view of a graphite layer 42 affixed to a metal layer 43 by a bonding agent 19, to form a multi-layer metal and graphite heat spreader. The graphite layer 42 is shown affixed to a metal layer 43 on only one side, but multiple sides of the graphite layer may be clad in, or adhered to, metal. It should be appreciated that the bonding agent 19 may be omitted in some embodiments.

As mentioned previously, most metals are thermally isotropic and so heat dissipation occurs in all directions 44. By contrast, graphite is anisotropic so heat transfer occurs along the length 45 of graphite layer 42. By combining these isotropic and anisotropic heat dissipating properties, unique thermal energy dissipating structures may be created.

For example, in some embodiments, layers 19 of thermoplastic polymer resin such as PET (Polyethylene terephthalate) may be laminated between layers 42 and 43. Layers 42 and 43 may be thermally connected by thermal connectors 46 to allow heat flow to or from copper layer 43 to or from graphite layer 42.

Figure 12:
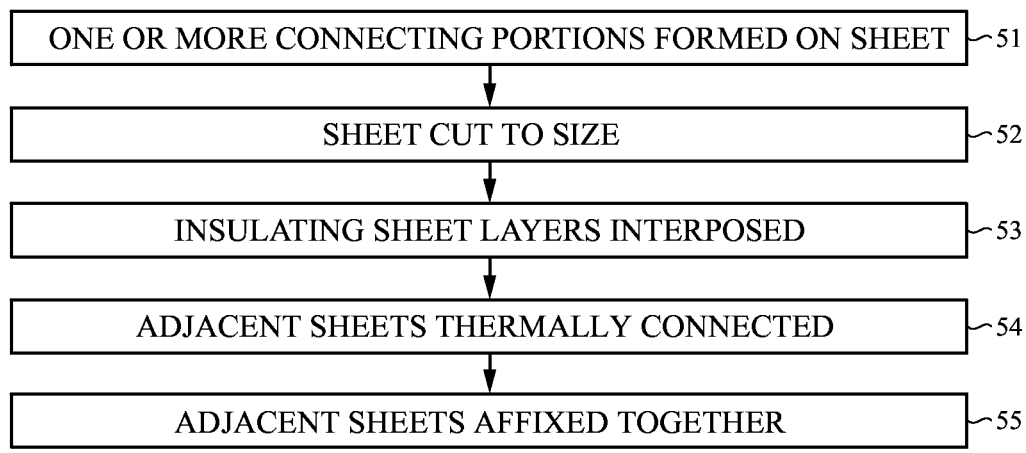

FIG. 12 is a flowchart showing one sample process for forming a heat spreader 14. In operation 51, one or more contact regions 16, 17, 18 may be formed on multiple sheets or structures of an anisotropic material such as pyrolytic graphite or any other suitable material. In operation 52, a layer physically connected to a contact region may be cut to size from a larger material. It should be appreciated that operations 51 and 52 may be reversed or combined.

In operation 53, insulating layers such as polyethylene terephthalate (PET) may be interposed between the multiple graphite layers. This is an optional operation; insulating layers are not required between the graphite layers and may not be used in some embodiments. In operation 54, adjacent layers (e.g., layers 11, 12, 13 of a heat spreader 14) may be thermally connected to one another, for example through vias, patches, wells, and the like, all of which may transfer heat between layers. It should be appreciated that operation 54 is optional and may be omitted in many embodiments.

In operation 55, the adjacent layers may be affixed together to form a heat spreader with one or more contact regions on each layer, for example through lamination, adhesion, ultrasonic welding, or the like. After operation 55, the heat spreader 14 may be considered formed and ready for use in a suitable electronic device, such as a communications device, tablet computing device, laptop computer, wearable device, desktop computer, server, appliance, and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. A heat spreader comprising:
   a group of layers, wherein a given layer in the group of layers has a height and a lateral area and the given layer is formed from an anisotropic thermal material that conducts more heat across the lateral area than along the height of the given layer; and
   at least one contact region physically and thermally connected to each of the layers in the group of layers, wherein each of the layers in the group of layers is affixed to an adjacent layer of the group of layers.

2. The heat spreader of claim 1, wherein:
   the at least one contact region is co-planar with respect to a common plane; and
   the group of layers extends perpendicularly with respect to the common plane.

3. The heat spreader of claim 1, further comprising an insulating layer positioned between adjacent first and second layers from the group of layers.

4. The heat spreader of claim 1, wherein the group of layers includes at least one folded layer of anisotropic thermal material.

5. The heat spreader of claim 1 wherein the group of layers comprises:
   at least two sheets; and
   a thermal connector coupling the at least two sheets.

6. The heat spreader of claim 5, wherein the thermal connector is a metal.

7. The heat spreader of claim 1, wherein:
   at least one layer of the group of layers is a graphite layer;
   another layer of the group of layers is a metal layer; and
   the metal layer is thermally connected to the graphite layer.

8. The heat spreader of claim 1, wherein at least one layer of the group of layers is angled with respect to a common plane and the contact regions are co-planar with respect to the common plane.

9. The heat spreader of claim 1, wherein each layer of the group of layers comprises multiple contact regions.

10. A portable electronic device comprising:
a heat source; and
a heat spreader connected to the heat source and comprising a group of layers, each of the layers in the group of layers being formed from an anisotropic thermal material; wherein:
a given layer of the group of layers is physically adjacent the heat source; and
the given layer conducts heat in a first direction and resists heat transfer in a second direction.

11. The portable electronic device of claim 10, further comprising a heat sink thermally connected to the layer; wherein
the given layer preferentially conducts heat from the heat source, in the first direction, to the heat sink.

12. The portable electronic device of claim 11 further comprising:
a second heat source; wherein:
a second layer of the group of layers is physically and thermally connected to the second heat source by a contact region; and
the second layer conducts heat in a third direction, away from the second heat source, and resists heat transfer in a fourth direction.

13. The portable electronic device of claim 12, wherein the second layer is thermally connected to the heat sink.

14. The portable electronic device of claim 12, wherein each layer of the group of layers comprises first and second contact regions, the first contact regions being physically and thermally connected to the heat source, and the second contact regions being physically and thermally connected to the second heat source.

15. The portable electronic device of claim 10, wherein a thickness of the layer is greater than an effective thickness, thereby reducing thermal transfer from the layer to an adjacent layer.

16. The portable electronic device of claim 10, wherein each of the layers in the group of layers is thermally isolated from all other layers in the group of layers.

17. The portable electronic device of claim 10, wherein a second layer of the group of layers is formed from a metal.

18. The portable electronic device of claim 17, wherein the second layer conducts heat isotropically.

19. The portable electronic device of claim 10, wherein the given layer wraps around the heat source and contacts the heat source on multiple sides.

20. A heat spreader comprising:
a first sheet having a first coplanar contact region attached to a first transfer surface; and
a second sheet stacked on the first sheet, wherein the second sheet has a second coplanar region, a second transfer surface, and a bent portion coupled between the second transfer surface and the second coplanar contact region, and the first and second coplanar contact regions are coplanar with the first transfer surface.

* * * * *